(12) United States Patent
Jeong et al.

(10) Patent No.: US 12,125,536 B2
(45) Date of Patent: Oct. 22, 2024

(54) MEMORY DEVICE AND OPERATING METHOD THEREOF

(71) Applicant: SK hynix Inc., Gyeonggi-do (KR)

(72) Inventors: Chan Hui Jeong, Gyeonggi-do (KR); Dong Hun Kwak, Gyeonggi-do (KR); Se Chun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 133 days.

(21) Appl. No.: 17/703,625

(22) Filed: Mar. 24, 2022

(65) Prior Publication Data

US 2023/0113235 A1   Apr. 13, 2023

(30) Foreign Application Priority Data

Oct. 7, 2021   (KR) .................. 10-2021-0133218

(51) Int. Cl.

| | | |
|---|---|---|
| *G11C 16/08* | (2006.01) | |
| *G11C 16/10* | (2006.01) | |
| *G11C 16/30* | (2006.01) | |
| *G11C 16/34* | (2006.01) | |
| G11C 16/04 | (2006.01) | |

(52) U.S. Cl.
CPC .............. *G11C 16/08* (2013.01); *G11C 16/10* (2013.01); *G11C 16/30* (2013.01); *G11C 16/3459* (2013.01); *G11C 16/0483* (2013.01)

(58) Field of Classification Search
None
See application file for complete search history.

(56) References Cited

U.S. PATENT DOCUMENTS

| 9,564,232 B1* | 2/2017 | Lee | .......................... G11C 16/10 |
|---|---|---|---|
| 2006/0245260 A1* | 11/2006 | Kim | ................... G11C 16/3418 |
| | | | 365/185.23 |
| 2021/0082505 A1* | 3/2021 | Suzuki | ................... G11C 16/08 |

FOREIGN PATENT DOCUMENTS

| KR | 10-2016-0011068 A | 1/2016 |
|---|---|---|
| KR | 10-2019-0002369 A | 1/2019 |

* cited by examiner

*Primary Examiner* — Alfredo Bermudez Lozada
(74) *Attorney, Agent, or Firm* — IP & T GROUP LLP

(57) ABSTRACT

The present disclosure relates to an electronic device. A memory device includes a plurality of memory cells coupled to a plurality of word lines, a voltage generator generating program-related voltages to be applied to the plurality of word lines, an address decoder transferring the program-related voltages to the plurality of word lines, and an operation controller controlling the voltage generator and the address decoder to apply a program voltage to a selected word line among the plurality of word lines, a second pass voltage to adjacent word lines neighboring the selected word line, a first pass voltage to remaining word lines except for the selected word line and the adjacent word lines, and to apply a ground voltage to the selected word line and the first pass voltage to the adjacent word lines during a first period.

5 Claims, 15 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2021-0133218 filed on Oct. 7, 2021, the entire disclosure of which is incorporated by reference herein.

BACKGROUND

Field of Invention

Various embodiments of the present disclosure relate generally to an electronic device, and more particularly, to a memory device and a method of operating the memory device.

Description of Related Art

A semiconductor memory device is a memory device which is embodied by using semiconductors such as silicon (Si), germanium (Ge), gallium arsenide (GaAs), and indium phosphide (InP). Memory devices are generally classified into volatile memory devices and nonvolatile memory devices.

Volatile memory devices may lose stored data when powered off. Examples of the volatile memory devices may include a static random access memory (SRAM), a dynamic RAM (DRAM), a synchronous DRAM (SDRAM), and the like. Nonvolatile memory devices may retain stored data regardless of power on/off conditions. Examples of the nonvolatile memory devices may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memories may be generally classified into NOR-type memories and NAND-type memories.

SUMMARY

Various embodiments of the present disclosure are directed to a memory device capable of reducing a program time and an operating method thereof.

According to an embodiment of the present disclosure, a memory device may include a memory block including a plurality of memory cells coupled to a plurality of word lines, a voltage generator generating program-related voltages including a program voltage, a first pass voltage, a second pass voltage, a third pass voltage, a hold voltage, and a verify voltage to be applied to the plurality of word lines, an address decoder transferring the program-related voltages to the plurality of word lines, and an operation controller controlling the voltage generator and the address decoder to apply the program voltage to a selected word line among the plurality of word lines, the second pass voltage to adjacent word lines neighboring the selected word line, the first pass voltage to remaining word lines except for the selected word line and the adjacent word lines among the plurality of word lines, and to apply a ground voltage to the selected word line and the first pass voltage to the adjacent word lines during a first period after the application of the program voltage and the first pass voltage and the second pass voltage.

According to an embodiment of the present disclosure, a method of operating a memory device including a plurality of memory cells coupled to a plurality of word lines, may include applying a program voltage to a selected word line among the plurality of word lines, a first pass voltage to remaining word lines except for the selected word line and adjacent word lines neighboring the selected word line among the plurality of word lines, and a second pass voltage to the adjacent word lines, and applying a ground voltage to the selected word line and the first pass voltage to the adjacent word lines.

According to an embodiment of the present disclosure, a memory device may include a plurality of memory cells coupled to a plurality of word lines, a peripheral circuit performing a program operation including a program voltage applying operation and a verify operation, the program voltage applying operation including applying a program voltage to a selected word line coupled to selected memory cells among the plurality of memory cells and the verify operation including verifying whether a threshold voltage of each of the selected memory cells has reached a threshold voltage corresponding to a target program state by applying a verify voltage to the selected word line, and an operation controller controlling, during the verify operation, the peripheral circuit to apply a voltage lower than the verify voltage to the selected word line during a time determined by a magnitude of the verify voltage, and to apply the verify voltage to the selected word line after the determined time.

According to an embodiment of the present disclosure, a memory device may include memory cell groups respectively coupled to a selected row line, adjacent row lines which is a neighbor of the selected row line, and remaining row lines, and a control circuit configured to perform a program operation on a group coupled to the selected row line, the program operation including a sequence of a pulse operation, a discharge operation and a verify operation, wherein the pulse operation includes applying a program voltage to the selected row line, and applying a first pass voltage to the adjacent and remaining row lines and then a second pass voltage to the adjacent row lines, wherein the discharge operation includes applying a ground voltage to the selected row line and the first pass voltage to the adjacent row lines until all of the row lines reach the first pass voltage, and applying, to all of the row lines having the first pass voltage, the ground voltage and then a hold voltage, and wherein the verify operation includes applying, to the selected row line, a lower voltage than a verify voltage for a predetermined time amount which depends on a level of the verify voltage, and then the verify voltage, and applying a third pass voltage to the adjacent and remaining row lines.

DETAILED DESCRIPTION

Specific structural or functional descriptions of examples of embodiments in accordance with concepts which are disclosed in this specification are illustrated only to describe the examples of embodiments in accordance with the concepts. The examples of embodiments in accordance with the concepts may be carried out by various forms but the descriptions are not limited to the examples of embodiments described in this specification.

Figure 1:
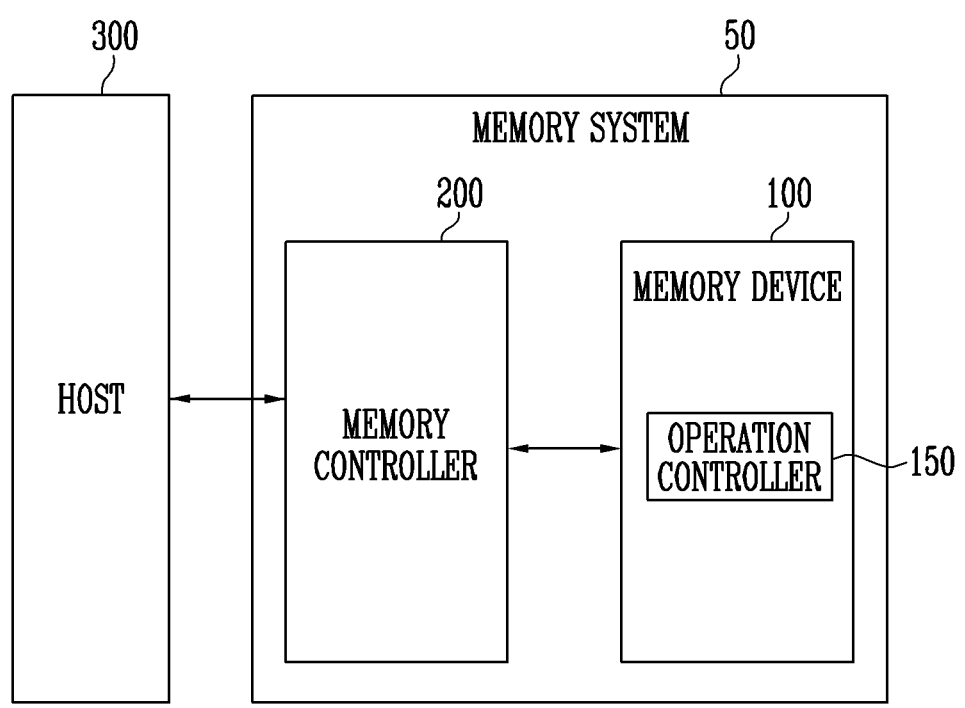
FIG. 1 is a block diagram illustrating a memory system including a memory device according to an embodiment of the present disclosure.

FIG. 1 is a block diagram illustrating a memory system 50 that includes a memory device 100 according to an embodiment of the present disclosure.

Referring to FIG. 1, the memory system 50 may include the memory device 100 and a memory controller 200. The memory system 50 may be configured to store data in response to control of a host 300. Examples of the memory system 50 may include a cellular phone, a smartphone, an MP3 player, a laptop computer, a desktop computer, a game player, a TV, a tablet PC, and an in-vehicle infotainment system.

The memory system 50 may be manufactured as one of various types of storage devices according to a host interface corresponding to a communication method with the host 300. For example, the memory system 50 may be configured as any of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-e or PCIe) card type storage device, a compact flash (CF) card, a smart media card, and a memory stick.

The memory system 50 may be manufactured as any of various types of packages. For example, the memory system 50 may be manufactured as any of various package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to control of the memory controller 200. The memory device 100 may include a memory cell array (not shown) which includes a plurality of memory cells storing data.

Each of the plurality memory cells included in the memory cell array may be a single level cell (SLC) which stores one bit of data, a multi-level cell (MLC) which stores two bits of data, a triple level cell (TLC) which stores three bits of data, or a quadruple level cell (QLC) which stores four bits of data.

The memory cell array (not shown) may include a plurality of memory blocks. Each of the memory blocks may include a plurality of memory cells. One memory block may include a plurality of pages. According to an embodiment, a page may be a unit for storing data in the memory device 100 or reading data stored in the memory device 100. A memory block may be a unit for erasing data.

According to an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, by way of example, features and aspects of the invention are described in the context in which the memory device 100 is a NAND flash memory.

The memory device 100 may receive a command and an address from the memory controller 200 and access an area selected by the address in the memory cell array. The memory device 100 may perform an operation instructed by the command on the area selected by the address. For example, the memory device 100 may perform a write (program) operation, a read operation, and an erase operation. During a write operation, the memory device 100 may program data in the area selected by the address. During a read operation, the memory device 100 may read data from the area selected by the address. During an erase operation, the memory device 100 may erase data from the area selected by the address.

According to an embodiment, the memory device 100 may include an operation controller 150.

The operation controller 150 may control a program operation on the memory cells. The program operation may refer to an operation of storing data in the memory cells.

More specifically, during the program operation, threshold voltages of the memory cells may be increased according to data to be stored in the memory cells. When the program operation is performed on the memory cells, each of the memory cells may have threshold voltages corresponding to one of the plurality of program states. The plurality of program states may be determined based on the number of data bits which are stored in one memory cell. For example, when one memory cell is programmed as a triple level cell (TLC) which stores three bits of data, the plurality of program states may mean an erase state and first to seventh program states. The threshold voltages of the memory cells after the program operation is performed may be determined based on the data to be stored in the memory cells. Each of the memory cells may have one of the plurality of program states as a target program state on the basis of the data to store.

According to an embodiment, the program operation may include a program voltage applying operation and a verify operation. The program voltage applying operation may refer to an operation of increasing the threshold voltages of the memory cells using a program voltage. The verify operation may refer to an operation of verifying whether the threshold voltages of the memory cells have reached threshold voltages corresponding to the target program state by using a verify voltage.

According to an embodiment, the operation controller 150 may control voltages to be applied to word lines coupled to the memory cells during the program operation.

The memory controller 200 may control the general operation of the memory system 50.

When power is applied to the memory system 50, the memory controller 200 may execute firmware FW. When the memory device 100 is a flash memory device, the firmware FW may include a host interface layer HIL that controls communication with the host 300, a flash translation layer FTL that controls communication between the host 300 and the memory device 100, and a flash interface layer FIL that controls communication with the memory device 100.

According to an embodiment, the memory controller 200 may receive data and a logical block address (LBA) from the host 300, and translate the LBA into a physical block address (PBA) indicating an address of memory cells in which data included in the memory device 100 is to be stored. In the specification, the logical block address (LBA) may have the same meaning as a "logical address" or a "logic address." In the specification, the physical block address (PBA) may have the same meaning as a "physical address" or a "physic address."

The memory controller 200 may control the memory device 100 to perform a write operation, a read operation, an erase operation, or the like in response to a request from the host 300. During the write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

According to an embodiment, the memory controller 200 may generate and transfer a command, an address, and data to the memory device 100 regardless of a request from the host 300. For example, the memory controller 200 may provide commands, addresses, and data for performing a read operation and write operations involved in performing wear leveling, read reclaim, and garbage collection.

According to an embodiment, the memory controller 200 may control at least two memory devices 100. The memory controller 200 may control the memory devices 100 according to an interleaving scheme to improve operation performance. By the interleaving scheme, operations on at least two memory devices 100 may be controlled to overlap each other.

The host 300 may communicate with the memory system 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
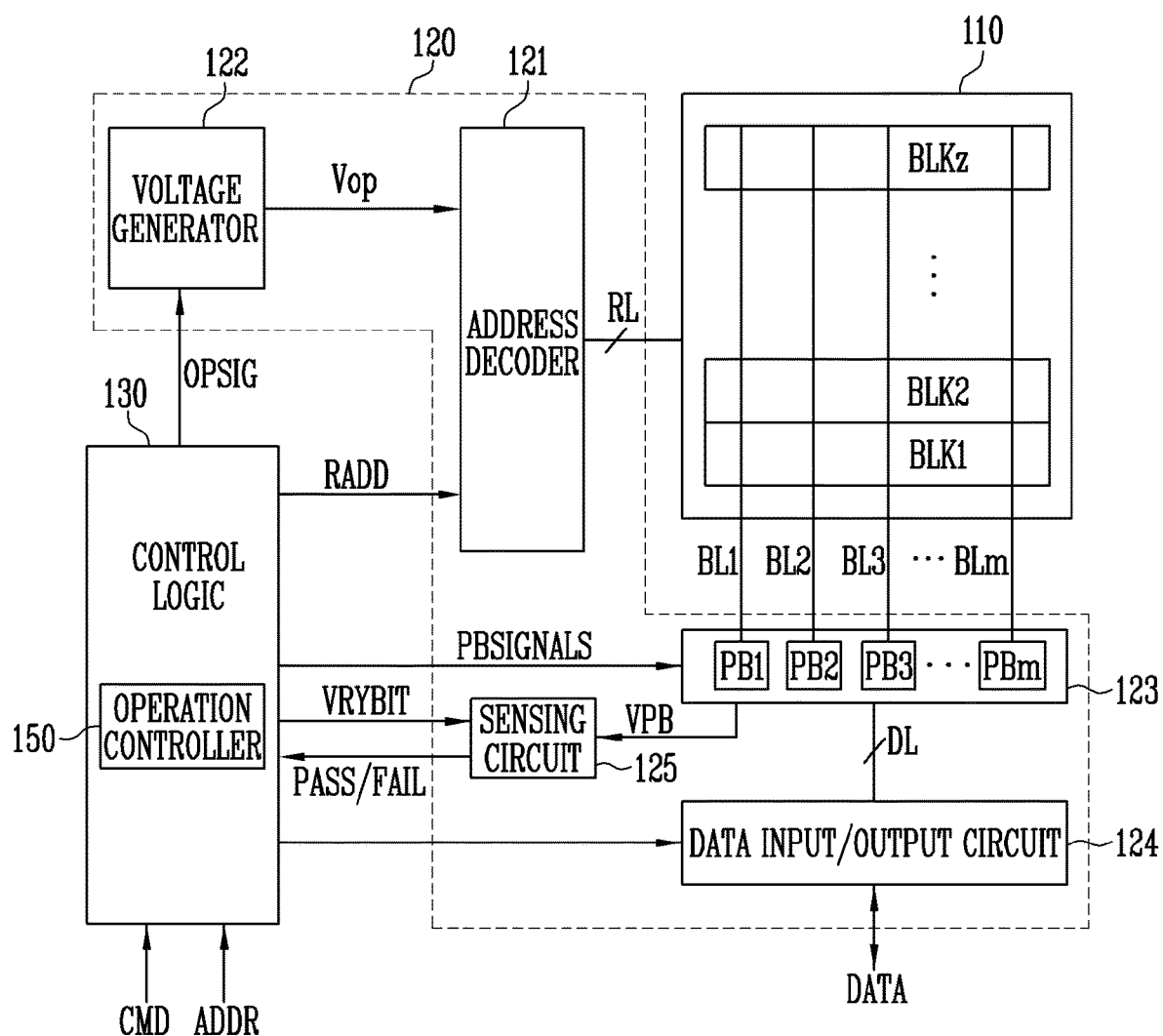
FIG. 2 is a diagram illustrating the structure of a memory device of FIG. 1 according to an embodiment of the present disclosure.

FIG. 2 is a diagram illustrating the structure of the memory device 100 of FIG. 1 according to an embodiment of the present disclosure.

Referring to FIG. 2, the memory device 100 may include a memory cell array 110, a peripheral circuit 120, and a control logic 130.

The memory cell array 110 may include the plurality of memory blocks BLK1 to BLKz. The plurality of memory blocks BLK1 to BLKz may be coupled to an address decoder 121 through row lines RL. The plurality of memory blocks BLK1 to BLKz may be coupled to a page buffer group 123 through bit lines BL1 to BLm. Each of the plurality of memory blocks BLK1 to BLKz may include a plurality of memory cells. According to an embodiment, a plurality of memory cells may be non-volatile memory cells. Memory cells coupled to the same word line, among the plurality of memory cells, may be defined as a single page. In other words, the memory cell array 110 may include a plurality of pages. According to an embodiment, each of the plurality of memory blocks BLK1 to BLKz included in the memory cell array 110 may include a plurality of dummy cells. One or more dummy cells may be coupled in series between a drain select transistor and memory cells and between a source select transistor and memory cells. Each of the plurality memory cells included in the memory device 100 may be a single level cell (SLC) which stores one bit of data, a multi-level cell (MLC) which stores two bits of data, a triple level cell (TLC) which stores three bits of data, or a quadruple level cell (QLC) which stores four bits of data.

The peripheral circuit 120 may drive the memory cell array 110. For example, the peripheral circuit 120 may drive the memory cell array 110 to perform a program operation, a read operation, and an erase operation in response to control of the control logic 130. In another example, the peripheral circuit 120 may apply various operating voltages to the row lines RL and the bit lines BL1 to BLm, or may discharge the applied voltages in response to control of the control logic 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment, the row lines RL may further include a pipe select line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address RADD of the received address ADDR. The address decoder 121 may select at least one word line WL from the selected memory block by applying voltages provided from the voltage generator 122 to at least word line WL according to the decoded row address RADD.

During a program operation, the address decoder 121 may apply a program voltage to the selected word line and a program pass voltage having a lower voltage level than the program voltage to unselected word lines. During a program verify operation, the address decoder 121 may apply a verify voltage to the selected word line and a verify pass voltage having a greater voltage level than the verify voltage to the unselected word lines.

During a read operation, the address decoder 121 may apply a read voltage to the selected word line and a read pass voltage having a greater voltage level than the read voltage to unselected word lines.

An erase operation of the memory device 100 may be performed in units of memory blocks. During the erase operation, the address ADDR which is input to the memory device 100 may include a block address. The address decoder 121 may decode the block address and select a single memory block in response to the decoded block address. During the erase operation, the address decoder 121 may apply a ground voltage to word lines which are coupled to the selected memory block.

According to an embodiment, the address decoder 121 may be configured to decode a column address of the transferred address ADDR. The decoded column address may be transferred to the page buffer group 123. For example, the address decoder 121 may include components such as a row decoder, a column decoder and an address buffer.

The voltage generator 122 may be configured to generate a plurality of operating voltages Vop by using an external power voltage which is supplied to the memory device 100. The voltage generator 122 may be controlled by the control logic 130.

According to an embodiment, the voltage generator 122 may generate an internal power voltage by regulating the external power voltage. The internal power voltage generated by the voltage generator 122 may serve as an operating voltage of the memory device 100.

According to an embodiment, the voltage generator 122 may generate various operating voltages Vop which are applied for performing program, read and erase operations in response to an operation signal OPSIG. The voltage generator 122 may generate the plurality of operating voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors which receive the internal power voltage to generate the plurality of operating voltages Vop having various voltage levels, and may generate the plurality of operating voltages Vop by selectively activating the plurality of pumping capacitors in response to control of the control logic 130.

The plurality of operating voltages Vop may be supplied to the memory cell array 110 by the address decoder 121. The page buffer group 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to the control of the control logic 130.

The first to mth page buffers PB1 to PBm may communicate data DATA with the data input/output circuit 124. During a program operation, the first to mth page buffers PB1 to PBm may receive the data DATA to be stored through the data input/output circuit 124 and data lines DL.

During a program operation, when a program pulse is applied to the selected word line, the first to mth page buffers PB1 to PBm may transfer the data DATA received through the data input/output circuit 124 to selected memory cells through the bit lines BL1 to BLm. The memory cells of the selected page may be programmed according to the transferred data DATA. A memory cell coupled to a bit line to which a program permission voltage (e.g., a ground voltage) is applied may have an increased threshold voltage. On the other hand, a threshold voltage of a memory cell coupled to a bit line to which a program inhibition voltage (for example, a power voltage) is applied may be maintained. During a program verify operation, the first to mth page buffers PB1 to PBm may read the data DATA stored in the memory cells through the bit lines BL1 to BLm from the selected memory cells.

During a read operation, the page buffer group 123 may read the data DATA from the memory cells of the selected page through bit lines BL and may store the read data DATA in the first to mth page buffers PB1 to PBm.

During an erase operation, the page buffer group 123 may float the bit lines BL. According to an embodiment, the page buffer group 123 may include a column selector.

According to an embodiment, while data stored in some of the plurality of page buffers included in the page buffer group 123 is programmed into the memory cell array 110, other page buffers may receive new data from the memory controller 200 and store the new data.

The data input/output circuit 124 may be coupled to the first to mth page buffers PB1 to PBm through the data lines DL. The data input/output circuit 124 may operate in response to control of the control logic 130.

The data input/output circuit 124 may include a plurality of input/output buffers (not shown) that receive the input data DATA. During a program operation, the data input/output circuit 124 may receive the data DATA to be stored from an external controller (not shown). During a read operation, the data input/output circuit 124 may output the data DATA transferred from the first to mth page buffers PB1 to PBm included in the page buffer group 123 to the external controller.

During a read operation or a verify operation, the sensing circuit 125 may generate a reference current in response to an allowable bit VRYBIT that is generated by the control logic 130 and may output a pass signal or a fail signal to the control logic 130 by comparing a sensing voltage VPB received from the page buffer group 123 with a reference voltage generated by the reference current.

The control logic 130 may be coupled to the address decoder 121, the voltage generator 122, the page buffer group 123, the data input/output circuit 124, and the sensing circuit 125. The control logic 130 may be configured to control the general operations of the memory device 100. The control logic 130 may operate in response to a command CMD transferred from an external device.

The control logic 130 may control the peripheral circuit 120 by generating various signals in response to the command CMD and the address ADDR. For example, the control logic 130 may output the operation signal OPSIG, the row address RADD, read and write control signals PBSIGNALS, and the allowable bit VRYBIT in response to the command CMD and the address ADDR. The control logic 130 may output the operation signal OPSIG to the voltage generator 122, output the row address RADD to the address decoder 121, output a read and write control signal to the page buffer group 123, and output the allowable bit VRYBIT to the sensing circuit 125. In addition, the control logic 130 may determine whether a verify operation passes or fails in response to a pass or fail signal PASS/FAIL output by the sensing circuit 125.

According to an embodiment, the control logic 130 may include the operation controller 150. The operation controller 150 may control the peripheral circuit 120 to perform a program operation. The program operation may include a program voltage applying operation and a verify operation.

According to an embodiment, the operation controller 150 may control the peripheral circuit 120 to apply program-related voltages to the plurality of word lines during a program operation. The program-related voltages may be applied to the plurality of word lines during the program operation. The program-related voltages may include a program voltage, a plurality of pass voltages, a hold voltage, a verify pass voltage, and a ground voltage. According to an embodiment, the operation controller 150 may control the peripheral circuit 120 so that the voltage magnitude of the plurality of word lines may be changed during a program operation.

More specifically, the operation controller 150 may control the voltage generator 122 to generate the program-related voltages. Subsequently, the voltage generator 122 may provide the generated program-related voltages to the address decoder 121. The address decoder 121 may transfer the program-related voltages to the plurality of word lines. The voltage magnitude of the plurality of word lines may be changed by the program-related voltages during a program operation. More specifically, the voltage magnitude of the plurality of word lines may be changed by the program-related voltages applied during each of the program voltage applying operation and the verify operation.

Figure 3:
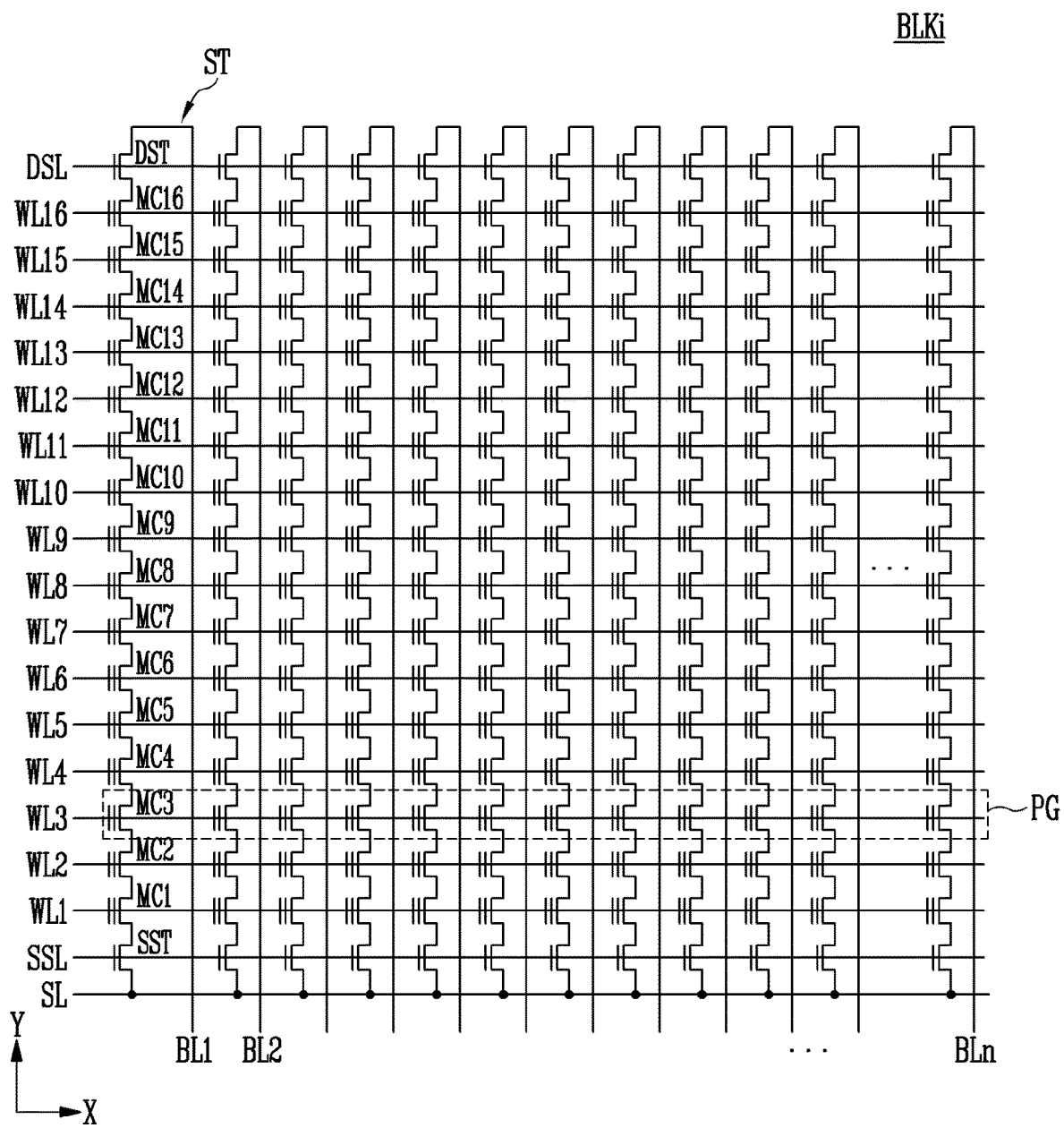
FIG. 3 is a diagram illustrating the structure of one of a plurality of memory blocks BLK1 to BLKz of FIG. 2 according to an embodiment of the present disclosure.

FIG. 3 is a diagram illustrating the structure of one of the plurality of memory blocks BLK1 to BLKz of FIG. 2 according to an embodiment of the present disclosure.

A memory block BLKi may refer to one of the memory blocks BLK1 to BLKz as shown in FIG. 2.

Referring to FIG. 3, a plurality of word lines that are arranged in parallel may be coupled between a first select line and a second select line. The first select line may be a source select line SSL and the second select line may be a drain select line DSL. More specifically, the memory block BLKi may include a plurality of strings ST that are coupled between bit lines BL1 to BLn and a source line SL. The bit lines BL1 to BLn may be coupled to the strings ST, respectively, and the source line SL may be coupled in common to the strings ST. Since the strings ST may have the same configuration, the string ST which is coupled to the first bit line BL1 will be described in detail by way of example.

The string ST may include a source select transistor SST, a plurality of memory cells MC1 to MC16, and a drain select transistor DST which are coupled in series between the source line SL and the first bit line BL1. A single string ST may include at least one source select transistor SST, at least one drain select transistor DST, and more memory cells than the memory cells MC1 to MC16 as shown in FIG. 3.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16. A group of memory cells coupled to the same word line, among memory cells included in different strings ST, may be referred to as a physical page PG. Therefore, the memory block BLKi may include as many physical pages PG as the number of word lines WL1 to WL16.

One memory cell may store one bit of data. This memory cell is generally called a single level cell (SLC). One physical page PG may store one logical page (LPG) data. One LPG data may include as many data bits as the number of cells included in one physical page PG.

One memory cell may store two or more bits of data. One physical page PG may store two or more LPG data.

Figure 4:
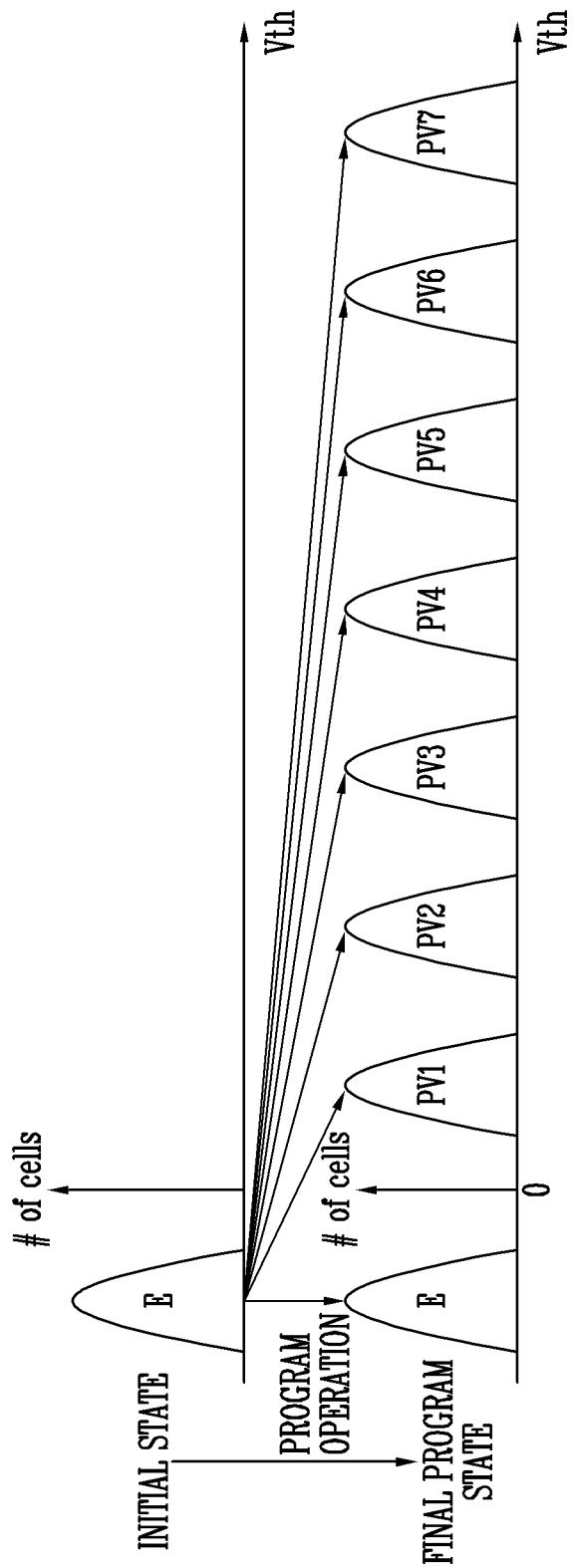
FIG. 4 is a diagram illustrating a threshold voltage distribution of memory cells by a program operation of a memory device according to an embodiment of the present disclosure.

FIG. 4 is a diagram illustrating a threshold voltage distribution of memory cells by a program operation of the memory device 100 according to an embodiment of the present disclosure.

In FIG. 4, the horizontal axis of the graph represents a threshold voltage Vth of a memory cell and the vertical axis of the graph represents the number of memory cells (# of cells).

Referring to FIG. 4, a threshold voltage distribution of the memory cells may change from an initial state to a final program state by a program operation.

In FIG. 4, one memory cell is programmed as a TLC which stores three bits of data.

The initial state may refer to a state in which a program operation is not performed, and the threshold voltage distribution of the memory cells may correspond to an erase state E.

The final program state may refer to a threshold voltage distribution of the memory cells on which the program operation has been performed. Each of the memory cells on which the program operation has been performed may have a threshold voltage corresponding to one of the plurality of program states. For example, when one memory cell is programmed as a TLC which stores three bits of data, the plurality of program states may refer to the erase state E and the first to seventh program states PV1 to PV7. According to an embodiment, the threshold voltages of the memory cells on which the program operation has been performed may have one of the erase state E and the first to seventh program states PV1 to PV7. The threshold voltages of the memory cells having the initial state may increase to threshold voltages corresponding to one of the erase state E and the first to seventh program states PV1 to PV7.

Each of the plurality of memory cells may have one of the erase state E and the first to seventh program states PV1 to PV7 as a target program state. The target program state may be determined by data to be stored in a memory cell. Each of the memory cells may have a threshold voltage corresponding to the target program state among the final program states by a program operation.

Figure 5:
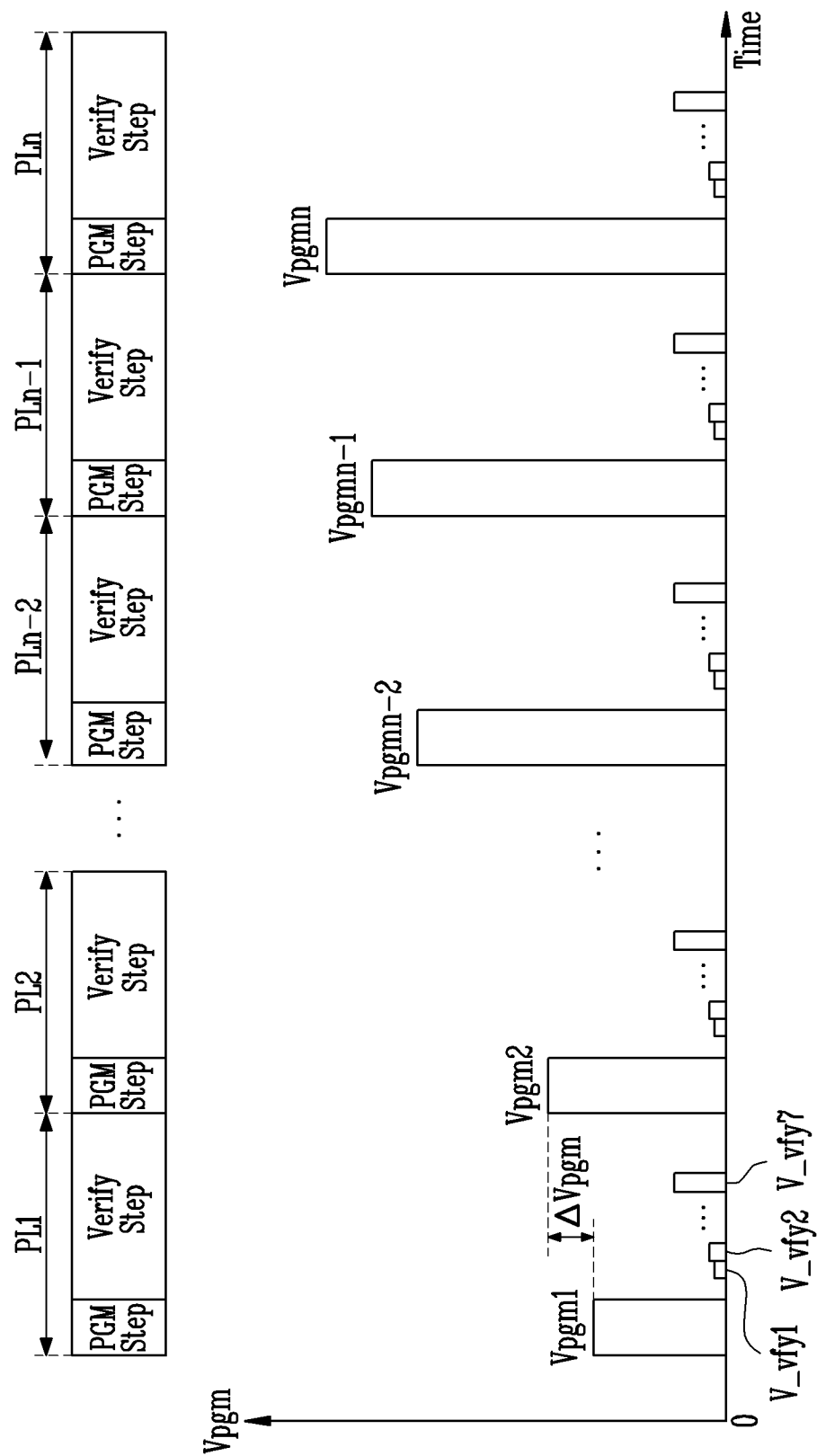
FIG. 5 is a diagram illustrating a program operation of a memory device according to an embodiment of the present disclosure.

FIG. 5 is a diagram illustrating a program operation of the memory device 100 according to an embodiment of the present disclosure.

In FIG. 5, the horizontal axis of the graph indicates time and the vertical axis of the graph indicates the magnitude of a program voltage Vpgm.

In FIG. 5, one memory cell is programmed as a TLC which stores three bits of data.

Referring to FIG. 5, a program operation of the memory device 100 may include a plurality of program loops PL1 to PLn. The memory device 100 may perform the program operation including the plurality of program loops PL1 to PLn so that selected memory cells coupled to a selected word line may have threshold voltages corresponding to one of a plurality of program states. For example, when one memory cell is programmed as a TLC, the memory device 100 may perform a program operation including the plurality of program loops PL1 to PLn so that each memory cell may have a threshold voltage corresponding to one of the erase state E and the first to seventh program states PV1 to PV7.

Each of the plurality of program loops PL1 to PLn may include a program voltage applying step PGM Step and a verify step Verify Step.

The program voltage applying step PGM Step may include applying a program voltage to the selected word line coupled to the selected memory cells. For example, the memory device 100 may apply a first program voltage Vpgm1 to the selected word line coupled to the selected memory cells in the first program loop PL1. After the first program voltage Vpgm1 is applied to the selected word line, each of the selected memory cells may have a threshold voltage corresponding to a target program state among the plurality of program states.

The verify step Verify Step may include applying a verify voltage to the selected word line coupled to the selected memory cells. The verify step Verify Step may include determining whether the threshold voltage of each of the selected memory cells corresponds to the target program state among the plurality of program states. The verify step Verify Step may include applying a verify voltage corresponding to the target program state of each of the selected memory cells. For example, when each of the selected memory cells is read as an off cell by the verify voltage corresponding to the target program state of each of the selected memory cells, the verify step Verify step may pass. In another example, when each of the selected memory cells is read as an on cell by the verify voltage corresponding to the target program state of each of the selected memory cells, the verify step Verify step may fail.

According to an embodiment, the memory device 100 may apply first to seventh verify voltages V_vfy1 to V_vfy7 after applying the first program voltage Vpgm1 to the selected word line coupled to the selected memory cells in the first program loop PL1. The verify step Verify Step using the first verify voltage V_vfy1 may be performed on memory cells having the first program state as the target program state. The verify step Verify Step using the second verify voltage V_vfy2 may be performed on memory cells having the second program state as the target program state. The verify step Verify Step using the third verify voltage V_vfy3 may be performed on memory cells having the third program state as the target program state. The verify step Verify Step using the fourth verify voltage V_vfy4 may be performed on memory cells having the fourth program state as the target program state. The verify step Verify Step using the fifth verify voltage V_vfy5 may be performed on memory cells having the fifth program state as the target program state. The verify step Verify Step using the sixth verify voltage V_vfy6 may be performed on memory cells having the sixth program state as the target program state. The verify step Verify Step using the seventh verify voltage V_vfy7 may be performed on memory cells having the seventh program state as the target program state. The magnitude of the verify voltages V_vfy1 to V_vfy7 may increase from the first verify voltage V_vfy1 toward the seventh verify voltage V_vfy7. More specifically, among the verify voltages V_vfy1 to V_vfy7, the first verify voltage V_vfy1 may have the smallest magnitude and the seventh verify voltage V_vfy7 have the largest magnitude. However, the number of verify voltages is not limited thereto.

Each of the memory cells on which the verify step Verify Step passes by each of the verify voltages V_vfy1 to V_vfy7 may be determined as having a threshold voltage corresponding to the target program state. The memory cells on which the verify step Verify Step passes may be program-inhibited in the second program loop PL2. A program inhibition voltage may be applied to a bit line coupled to the program-inhibited memory cells.

Each of the memory cells on which the verifying steps Verify Step using the verify voltages V_vfy1 to V_vfy7 fail may be determined as not having a threshold voltage corresponding to the target program state. The second program loop PL2 may be performed on the memory cells on which the verify step Verify Step fails.

In the second program loop PL2, the memory device 100 may apply a second program voltage Vpgm2 which is greater than the first program voltage Vpgm1 by a unit voltage ΔVpgm to the selected word line coupled to the selected memory cells. Hereinafter, the memory device 100 may perform the verify step Verify Step of the second program loop PL2 in the same manner as the verify step Verify Step of the first program loop PL1.

The memory device 100 may perform the next program loop in the same manner as the second program loop PL2 a predetermined number of times.

According to an embodiment, when a program operation is not completed within the predetermined number of times a program loop is performed, the program operation may fail. On the other hand, when the program operation is completed within the predetermined number of times the program loop is performed, the program operation may pass. Whether the program operation is completed may be determined depending on whether the verify step Verify Step on all the selected memory cells passes. When the verify step Verify Step on all selected memory cells passes, the next program loop may not be performed.

According to an embodiment, the program voltage may be determined according to an incremental step pulse programming (ISPP) method. A level of the program voltage may be increased or decreased gradually as the program loops PL1 to PLn are repeated. The number of times program voltages used in each of the program loops are applied may vary. Further, voltage levels, and voltage application times may vary and be determined in response to control of the memory controller 200.

Figure 6:
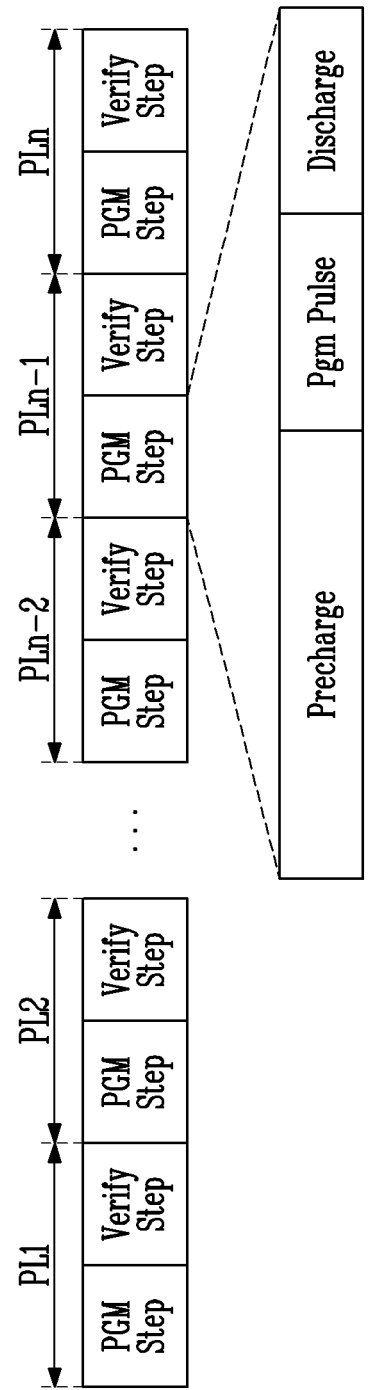
FIG. 6 is a diagram illustrating a program voltage applying step during a program operation of a memory device according to an embodiment of the present disclosure.

FIG. 6 is a diagram illustrating a process of applying a program voltage during a program operation of the memory device 100 according to an embodiment of the present disclosure.

Referring to FIG. 6, the program operation of the memory device 100 may include the plurality of program loops PL1 to PLn. Each of the plurality of program loops PL1 to PLn may include the program voltage applying step PGM Step and the verify step Verify Step. The program voltage applying step PGM Step may include a precharge period Precharge, a program pulse period Pgm Pulse, and a discharge period Discharge.

The precharge period Precharge may refer to a period in which a voltage of a bit line is precharged. For example, the memory device 100 may change the voltage of the bit line from a program permission voltage or a program inhibition voltage during the precharge period Precharge.

During the program pulse period Pgm Pulse, a program voltage may be applied to a selected word line. According to an embodiment, the memory device 100 may apply a pass voltage to an unselected word line while the program voltage is applied to the selected word line during the program pulse period Pgm Pulse.

During the discharge period Discharge, the voltage magnitude of the plurality of word lines may be reduced. According to an embodiment, during the discharge period Discharge, the memory device 100 may apply different voltages to the plurality of word lines to thereby reduce the voltage magnitude of the plurality of word lines. For example, the memory device 100 may apply different voltages to the selected word line, and a word line adjacent to the selected word line, and the remaining word lines except for the selected word line and the word line adjacent to the selected word line, among the plurality of word lines during the discharge period Discharge.

The memory device 100 may perform the verify step Verify Step after the discharge period Discharge ends.

Figure 7:
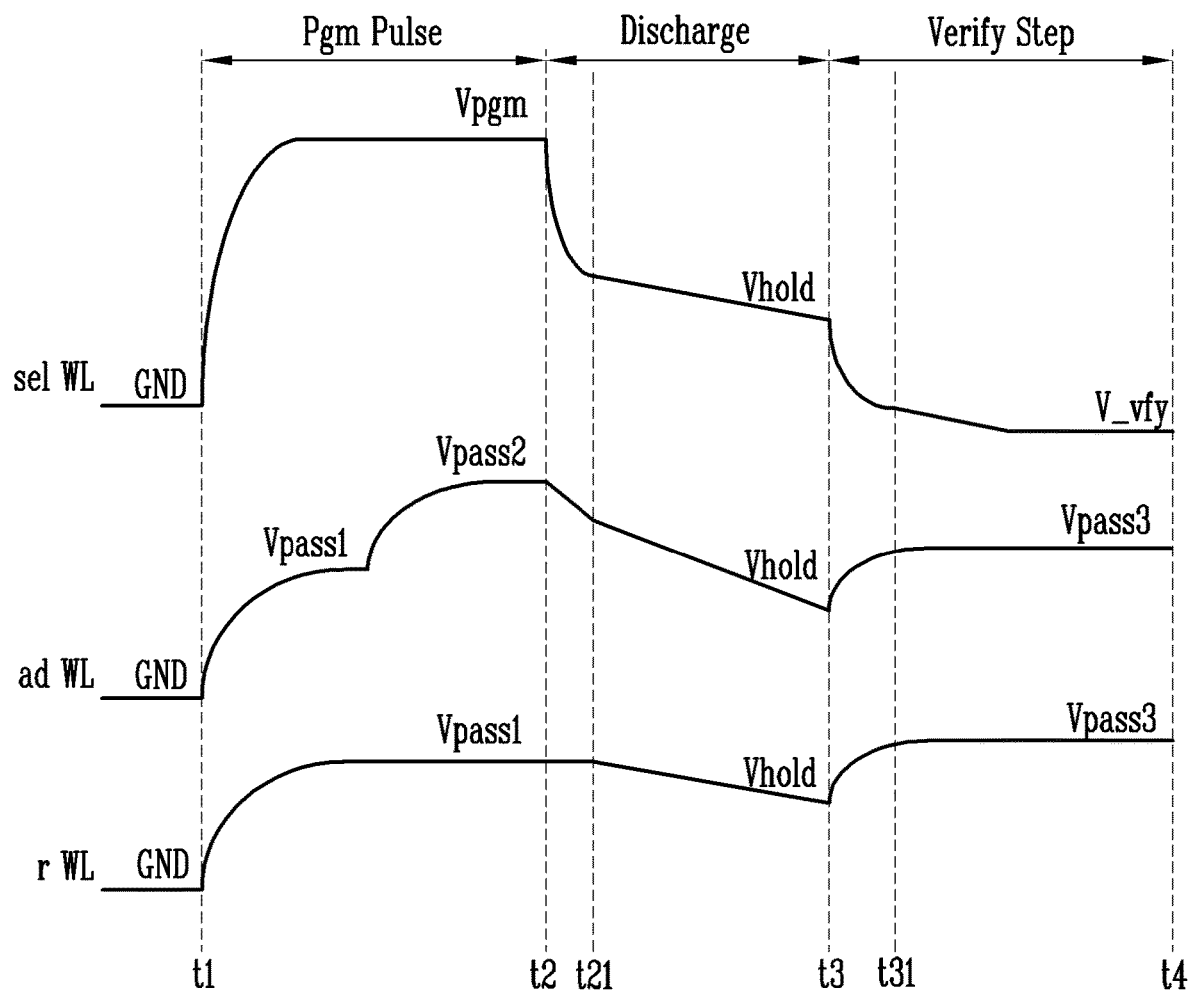
FIG. 7 is a diagram illustrating variations in magnitude of voltages of word lines by a program operation of a memory device according to an embodiment of the present disclosure.

FIG. 7 is a diagram illustrating variations in magnitude of voltages of word lines by a program operation of the memory device 100 according to an embodiment of the present disclosure.

Referring to FIG. 7, the memory device 100 may perform the verify step Verify Step after performing the program pulse period Pgm Pulse and the discharge period Discharge which are included in the program voltage applying step PGM Step.

Though not shown in FIG. 7, a period before a time t1 may be the precharge period Precharge. The memory device 100 may apply a ground voltage GND to a plurality of word lines (sel WL, ad WL, and r WL) during the precharge period Precharge.

A period between t1 and t2 may be the program pulse period Pgm Pulse. During the program pulse period Pgm Pulse, data may be stored in selected memory cells. The memory device 100 may apply the program voltage Vpgm to a selected word line sel WL during the program pulse period Pgm Pulse. The memory device 100 may apply a first pass voltage Vpass1 to word lines ad WL adjacent to the selected word line sel WL during the program pulse period Pgm Pulse.

The magnitude of the voltages of the word lines ad WL adjacent to the selected word line sel WL during the program pulse period Pgm Pulse may be changed by the program voltage Vpgm applied to the selected word line sel WL. More specifically, the voltage magnitude of the word lines ad WL adjacent to the selected word line sel WL may increase from the first pass voltage Vpass1 to a second pass voltage Vpass2 due to a coupling phenomenon therebetween.

The memory device 100 may apply the first pass voltage Vpass1 to remaining word lines r WL except for the selected word line sel WL and the word lines ad WL adjacent to the selected word line sel WL, among the plurality of word lines, during the program pulse period Pgm Pulse. The word lines ad WL adjacent to the selected word line sel WL and the remaining word lines r WL may be unselected word lines.

A period between t2 and t3 may be the discharge period Discharge. During the discharge period Discharge, the voltage magnitudes of the plurality of word lines sel WL, ad WL, and r WL may be reduced to a hold voltage Vhold.

More specifically, during a period from t2 to t21, the memory device 100 may apply a ground voltage to the selected word line sel WL. The voltage magnitude of the word lines ad WL adjacent to the selected word line sel WL during the period from t2 to t21 may be changed by the coupling phenomenon therebetween. More specifically, the voltage magnitude of the word lines ad WL adjacent to the selected word line sel WL may be reduced to be lower than the second pass voltage Vpass2 as the voltage of the selected word line sel WL is reduced. During the period from t2 to t21, the memory device 100 may maintain the voltage of the remaining word lines r WL at the first pass voltage Vpass1.

During a period from t21 to t3, the memory device 100 may perform an equalizing operation on the plurality of word lines sel WL, ad WL, and r WL. During the equalizing operation which is performed during the period from t21 to t3, the same voltage may be applied to the plurality of word lines sel WL, ad WL, and r WL. After the equalizing operation is terminated, the plurality of word lines sel WL, ad WL, and r WL may have the same voltage magnitude. During the period from t21 to t3, the memory device 100 may apply the hold voltage Vhold to the plurality of word lines sel WL, ad WL, and r WL. The changed voltage magnitude of the plurality of word lines sel WL, ad WL, and r WL after the equalizing operation ends may be greater than the hold voltage Vhold.

A period from t3 to t4 may be the verify step Verify Step. More specifically, during a period from t3 to t31, the memory device 100 may apply the ground voltage to the selected word line sel WL. During the period from t3 to t31, the memory device 100 may apply a third pass voltage Vpass3 to the word lines ad WL adjacent to the selected word line and the remaining word lines r WL. The third pass voltage Vpass3 may be a verify pass voltage.

During a period from t31 to t4, the memory device 100 may apply a verify voltage V_vfy to the selected word line sel WL. During the period from t31 to t4, the memory device 100 may maintain the voltages of the word lines ad WL adjacent to the selected word line and the remaining word lines r WL at the third pass voltage Vpass3.

Figure 8:
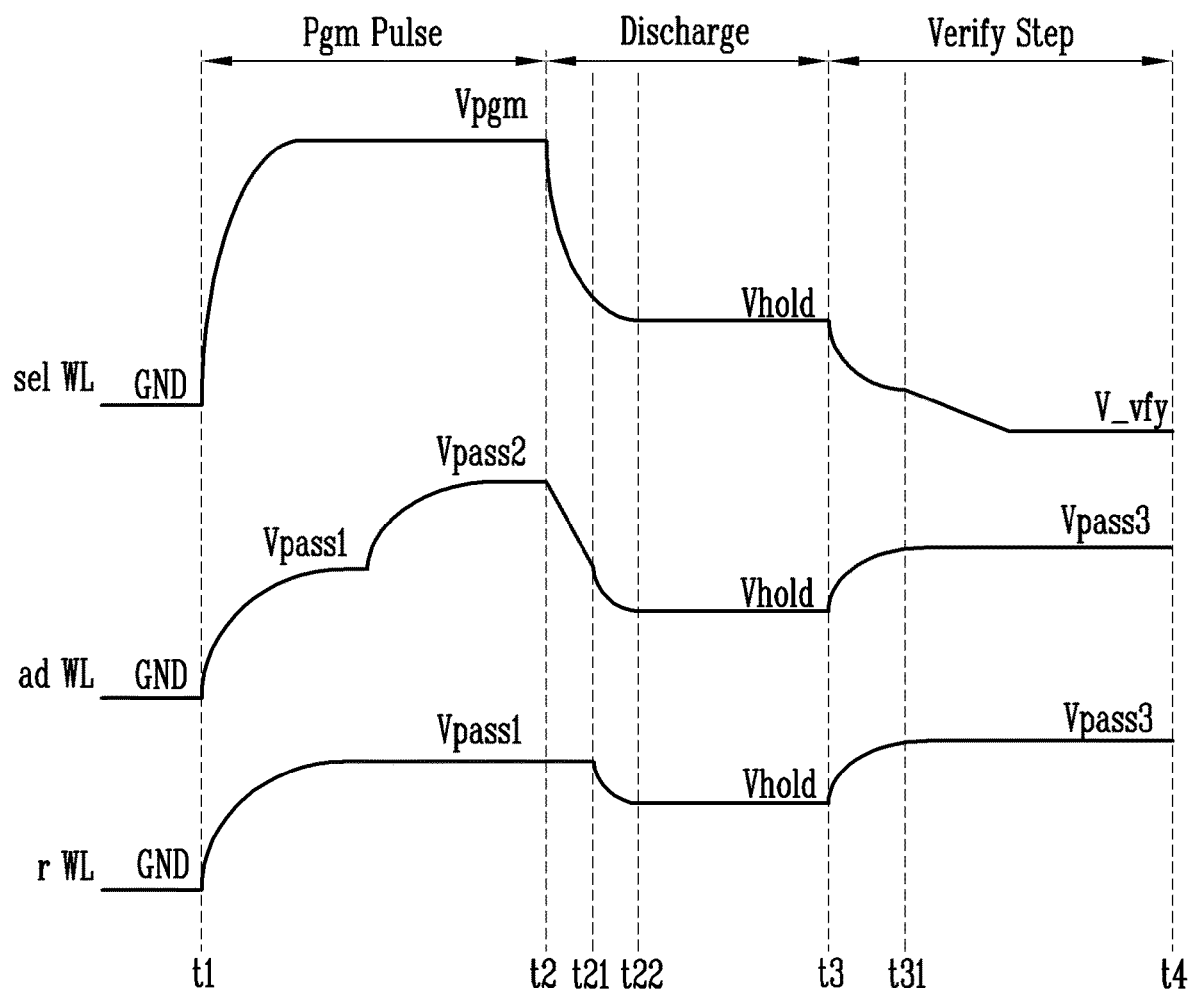
FIG. 8 is a diagram illustrating variations in magnitude of voltages of word lines by a program operation of a memory device according to an embodiment of the present disclosure.

FIG. 8 is a diagram illustrating variations in magnitude of voltages of word lines during a program operation of the memory device 100 according to an embodiment of the present disclosure.

Referring to FIG. 8, the memory device 100 may perform the verify step Verify Step after the program pulse period Pgm Pulse and the discharge period Discharge which are included in the program voltage applying step PGM Step.

Though not shown in FIG. 8, a period before a time t1 may be the precharge period Precharge. The memory device 100 may apply the ground voltage GND to the plurality of word lines sel WL, ad WL, and r WL during the precharge period Precharge.

A period between t1 and t2 may be the program pulse period Pgm Pulse. The memory device 100 may apply the program voltage Vpgm to the selected word line sel WL during the program pulse period Pgm Pulse. The memory device 100 may apply the first pass voltage Vpass1 to word lines ad WL adjacent to the selected word line sel WL during the program pulse period Pgm Pulse. For example, when the selected word line sel WL is the seventh word line WL7 as shown in FIG. 3, the word lines ad WL adjacent to the selected word line may be the sixth and eighth word lines WL6 and WL8. That is, when the selected word line sel WL is an nth word line, the word lines ad WL adjacent to the selected word line may be (n+1)th and (n−1)th word lines. When the selected word line sel WL is the nth word line, the word lines ad WL adjacent to the selected word line may be the (n+1)th, (n+2)th, (n−1)th and (n−2)th word lines.

According to an embodiment, the magnitude size of the word lines ad WL adjacent to the selected word line may increase from the first pass voltage Vpass1 to the second pass voltage Vpass2 by the program voltage Vpgm applied to the selected word line sel WL. According to another embodiment, the memory device 100 may apply the first pass voltage Vpass1 and then the second pass voltage Vpass2 to the word lines ad WL adjacent to the selected word line sel WL during a predetermined time in the program pulse period Pgm Pulse. The second pass voltage Vpass2 may be greater than the first pass voltage Vpass1.

The memory device 100 may apply the first pass voltage Vpass1 to the remaining word lines r WL during the program pulse period Pgm Pulse. The word lines ad WL adjacent to the selected word line sel WL and the remaining word lines r WL may be unselected word lines.

The period between t2 and t3 may be the discharge period Discharge. More specifically, during a period from t2 to t21, the memory device 100 may apply a ground voltage to the selected word line sel WL. During the period from t2 to t21, the memory device 100 may perform an equalizing operation on the word lines ad WL adjacent to the selected word line and the remaining word lines r WL. The equalizing operation performed during the period from t2 to t21 may refer to an operation of applying the same voltage to the word lines ad WL adjacent to the selected word line and the remaining word lines r WL. For example, during the period from t2 to t21, the memory device 100 may apply the first pass voltage Vpass1 to the word lines ad WL adjacent to the selected word line and the remaining word lines r WL. According to an embodiment, during the period from t2 to t21, the plurality of word lines sel WL, ad WL, and r WL may have the same voltage magnitude. For example, after the period between t2 and t21 ends, the plurality of word lines sel WL, ad WL, and r WL may have the voltage magnitude corresponding to the first pass voltage Vpass1.

During a period from t21 to t22, the memory device 100 may apply a ground voltage to the plurality of word lines sel WL, ad WL, and r WL. According to an embodiment, the memory device 100 may apply a ground voltage to the plurality of word lines sel WL, ad WL, and r WL until the voltage magnitude of the plurality of word lines sel WL, ad WL, and r WL is equal to or lower than the hold voltage Vhold. After the period between t21 and t22 ends, the voltage magnitude of the plurality of word lines sel WL, ad WL, and r WL may be equal to or less than the hold voltage Vhold.

During a period from t22 to t3, the memory device 100 may apply the hold voltage Vhold to the plurality of word lines sel WL, ad WL, and r WL. After the period between t22 and t3 ends, the plurality of word lines sel WL, ad WL, and r WL may have the voltage magnitude corresponding to the hold voltage Vhold. The hold voltage Vhold may be less than the first pass voltage Vpass1. The hold voltage Vhold may be greater than the ground voltage.

A period from t3 to t4 may be the verify step Verify Step. According to an embodiment, during a period from t3 to t31, the memory device 100 may apply a voltage, which is lower than the verify voltage V_vfy, to the selected word line sel WL. The voltage lower than the verify voltage V_vfy may be a negative voltage. According to another embodiment, the memory device 100 may apply the ground voltage to the selected word line sel WL during the period from t3 to t31. According to another embodiment, during the period from t3 to t31, the memory device 100 may apply the ground voltage to the selected word line sel WL after applying a voltage lower than the ground voltage to the selected word line sel WL during a predetermined time.

During a period from t3 to t31, the memory device 100 may apply the third pass voltage Vpass3 to the word lines ad WL adjacent to the selected word line and the remaining word lines r WL. The third pass voltage Vpass3 may be a verify pass voltage.

During a period from t31 to t4, the memory device 100 may apply the verify voltage V_vfy to the selected word line sel WL. During the period from t31 to t4, the memory device 100 may maintain the voltages of the word lines ad WL adjacent to the selected word line and the remaining word lines r WL at the third pass voltage Vpass3.

According to an embodiment, a length of the period between t3 and t31 may vary depending on the magnitude of the verify voltage V_vfy which is applied to the selected word line sel WL during the period from t31 to t4. For example, the length of the period between t3 and t31 may decrease as the magnitude of the verify voltage V_vfy which is applied to the selected word line sel WL during the period from t31 to t4 increases.

More specifically, after the period from t22 to t3 ends, the voltage magnitude of the selected word line sel WL may correspond to the hold voltage Vhold. At the verify step Verify Step which is performed during the period between t3 and t4, the voltage magnitude of the selected word line sel WL may decrease from the hold voltage Vhold to the verify voltage V_vfy.

The verify voltage V_vfy may be a threshold voltage corresponding to a target program state of selected memory cells coupled to the selected word line sel WL. The magnitude of the verify voltage V_vfy may vary depending on the target program state of the selected memory cells coupled to the selected word line sel WL.

For example, when one memory cell is programmed as a TLC, the verify voltage V_vfy may be one of the verify voltages V_vfy1 to V_vfy7 as shown in FIG. 5. The magnitudes of the verify voltages V_vfy1 to V_vfy7 may sequentially increase as the target program state increases. The verify step Verify Step using the first verify voltage V_vfy1 may be performed on memory cells having the first program state as the target program state among the selected memory cells. The magnitude of the first verify voltage V_vfy1 may be the lowest among the verify voltages V_vfy1 to V_vfy7. Therefore, when the target program state of the selected memory cells is the first program state, the voltage of the selected word line sel WL may decrease from the hold voltage Vhold to the first verify voltage V_vfy1 at the verify step Verify Step. The magnitude of the second verify voltage V_vfy2 may be greater than that of the first verify voltage V_vfy1. Therefore, the difference in magnitude between the hold voltage Vhold and the second verify voltage V_vfy2 when the target program state of the selected memory cells is the second program state may be less than the difference in magnitude therebetween when the target program state of the selected memory cells is the first program state. Namely, during the period from t3 to t31, a decrement by which the voltage of the selected word line sel WL decreases from the hold voltage Vhold to the verify voltage V_vfy when the verify voltage V_vfy is the second verify voltage V_vfy2 may be less than the decrement when the verify voltage V_vfy is the first verify voltage V_vfy1. Therefore, as the magnitude of the verify voltage V_vfy increases, the length of the period from t3 to t31 may decrease. Alternatively, as the magnitude of the verify voltage V_vfy increases, a time during which a voltage lower than the verify voltage V_vfy is applied to the selected word line sel WL may decrease. As the magnitude of the verify voltage V_vfy increases, a time during which a ground voltage is applied to the selected word line sel WL in the period from t3 to t31 may decrease.

In another embodiment, the length of the period from t3 to t31 may vary depending on a target program state of the selected memory cells that are coupled to the selected word line sel WL. For example, as the target program state of the selected memory cells increases, the length of the period from t3 to t31 may decrease. In another example, as the target program state of the selected memory cells increases, the time during which the voltage lower than the verify voltage V_vfy or the ground voltage is applied to the selected word line sel WL may decrease.

According to an embodiment of the present disclosure, the memory device 100 may apply the first pass voltage Vpass1 to the adjacent word lines ad WL adjacent to the selected word line and the remaining word lines r WL while the ground voltage is applied to the selected word line sel WL during the period from t2 to t21, so that the voltage magnitude of each of the plurality of word lines sel WL, ad WL, and r WL may be quickly reduced to the first pass voltage Vpass1.

After the memory device 100 according to an embodiment of the present disclosure applies the ground voltage to the plurality of word lines sel WL, ad WL, and r WL during the period from t21 to t22, the memory device 100 may apply the hold voltage Vhold to the plurality of word lines sel WL, ad WL, and r WL during the period from t22 to t3, so that the voltage magnitude of the plurality of word lines sel WL, ad WL, and r WL may be quickly reduced to the hold voltage Vhold.

After the memory device 100 according to an embodiment of the present disclosure applies a voltage lower than the verify voltage V_vfy or the ground voltage to the selected word line sel WL during the period from t3 to t31, the memory device 100 may apply the verify voltage V_vfy to the selected word line sel WL during the period from t31 to t4, so that the voltage magnitude of the selected word line sel WL may be quickly reduced to the verify voltage V_vfy. The memory device 100 according to an embodiment of the present disclosure may reduce a program time by quickly reducing the voltage magnitude of the plurality of word lines sel WL, ad WL, and r WL during a program operation.

Figure 9:
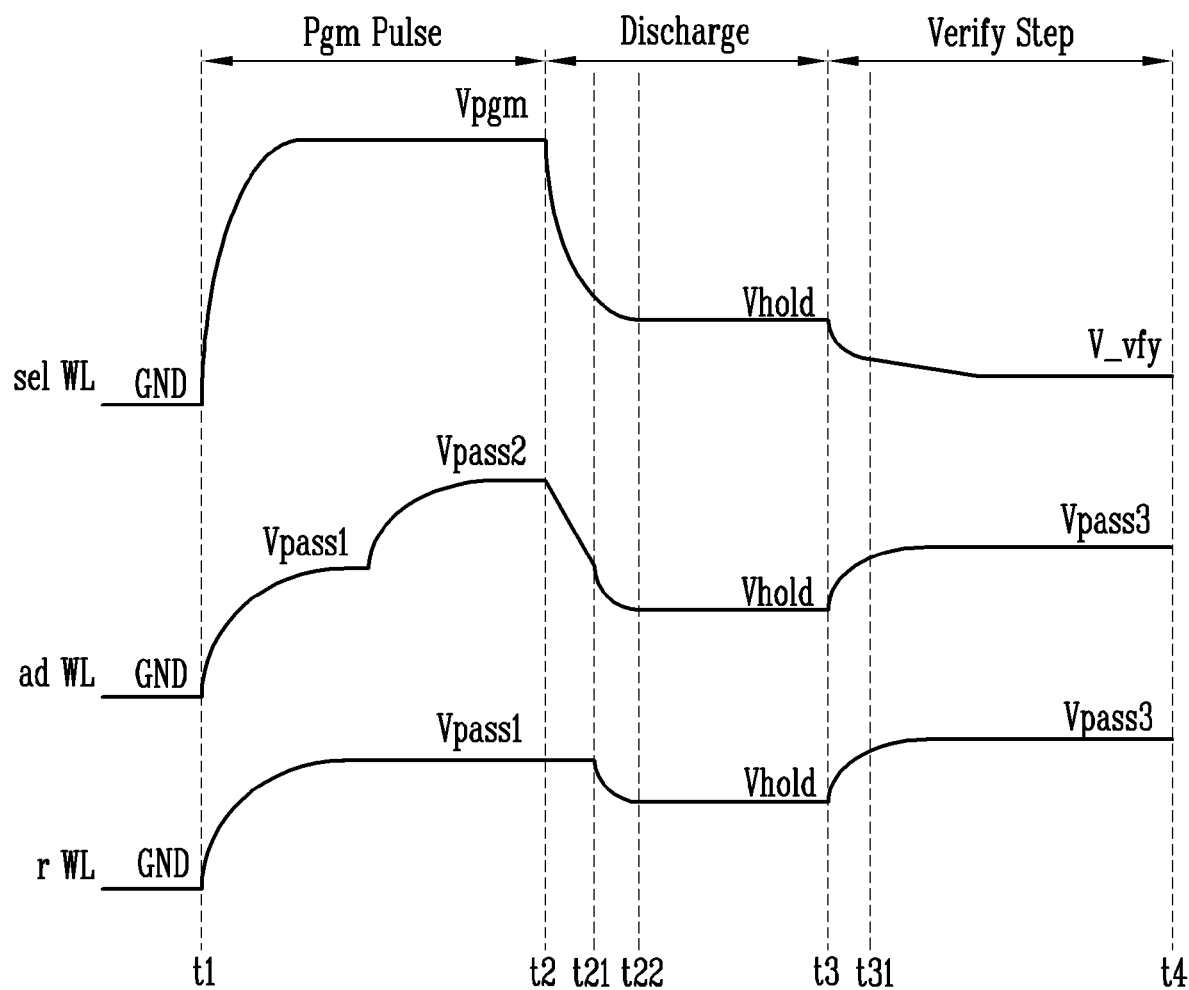
FIG. 9 is a diagram illustrating another example of variations in magnitude of voltages of word lines during a program operation of a memory device according to an embodiment of the present disclosure.

FIG. 9 is a diagram illustrating another example of variations in magnitude of voltages of word lines during a program operation of the memory device 100 according to an embodiment of the present disclosure.

FIG. 9 is a diagram additionally illustrating that the magnitude of the verify voltage V_vfy is changed at the verify step Verify Step during the program operation of the memory device 100 as described above with reference to FIG. 8. Therefore, in FIG. 9, a description of the components already described above with FIG. 8 will be omitted Referring to FIG. 9, during a period from t22 to t3, the memory device 100 may apply the hold voltage Vhold to the selected word line sel WL. After the period from t22 to t3 ends, the voltage magnitude of the selected word line sel WL may correspond to the hold voltage Vhold. Subsequently, during a period from t3 to t31, the memory device 100 may apply a ground voltage to the selected word line sel WL.

During a period from t31 to t4, the memory device 100 may apply the verify voltage V_vfy to the selected word line sel WL. The magnitude of the verify voltage V_vfy as shown in FIG. 9 may be greater than that of the verify voltage V_vfy as shown in FIG. 8. The verify voltage V_vfy as shown in FIG. 9 may correspond to a threshold voltage corresponding to the target program state of the selected memory cells which is greater than that of the verify voltage V_vfy as shown in FIG. 8. Therefore, the length of the period from t3 to t31 as shown in FIG. 9 may be smaller than the length of the period from t3 to t31 as shown in FIG. 8. In other words, as the magnitude of the verify voltage V_vfy increases, the length of the period from t3 to t31 may decrease. As the magnitude of the verify voltage V_vfy increases, a time during which the ground voltage is applied to the selected word line sel WL in the period from t3 to t31 may decrease.

Figure 10:
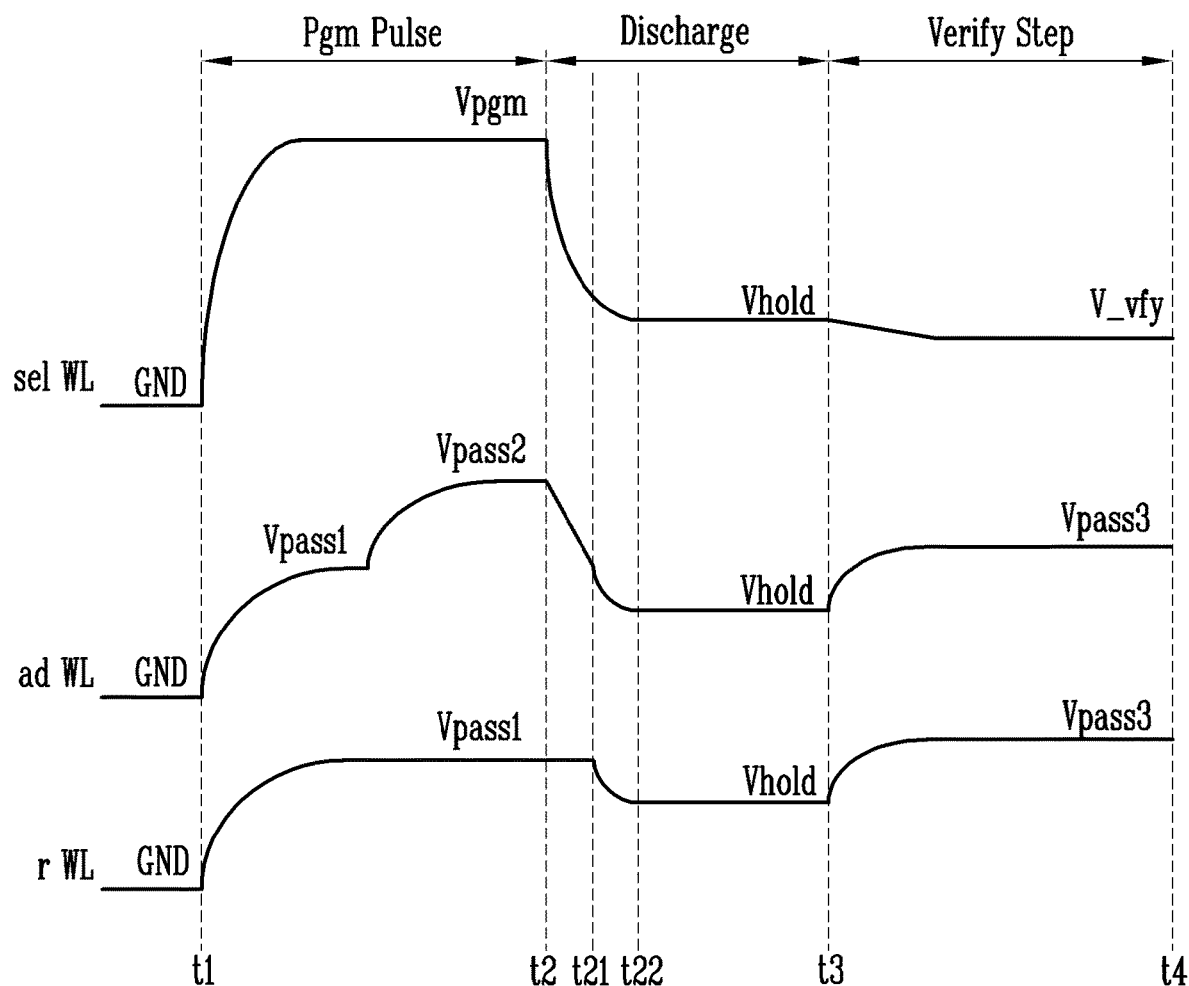
FIG. 10 is a diagram illustrating another example of variations in magnitude of voltages of word lines during a program operation of a memory device according to an embodiment of the present disclosure.

FIG. 10 is a diagram illustrating another example of variations in magnitude of voltages of word lines during a program operation of the memory device 100 according to an embodiment of the present disclosure.

In FIG. 10, a description of the components already described above with FIGS. 8 and 9 will be omitted.

Referring to FIG. 10, contrary to FIGS. 8 and 9, the memory device 100 may not apply a ground voltage to the selected word line sel WL at the verify step Verify Step. That is, after the period from t22 to t3 ends, the memory device 100 may apply the verify voltage V_vfy to the selected word line sel WL during the period from t3 to t4. According to an embodiment, the magnitude of the verify voltage V_vfy as shown in FIG. 10 may be greater than that of the verify voltage V_vfy as shown in FIGS. 8 and 9. In another embodiment, the verify voltage V_vfy may be a threshold voltage corresponding to the highest program state among the plurality of program states. As the magnitude of the verify voltage V_vfy increases, a difference in magnitude between the verify voltage V_vfy and the hold voltage Vhold may be reduced. Therefore, when the magnitude of the verify voltage V_vfy is greater than a predetermined magnitude, the memory device 100 may apply the verify voltage V_vfy to the selected word line sel WL without applying the ground voltage to the selected word line sel WL at the verify step Verify Step. When the magnitude of the verify voltage V_vfy is greater than the predetermined magnitude, the period from t3 to t31 as shown in FIGS. 8 and 9 may be skipped. When the magnitude of the verify voltage V_vfy is greater than the predetermined magnitude, the period from t3 to t31 may have a length of zero (0).

Figure 11:
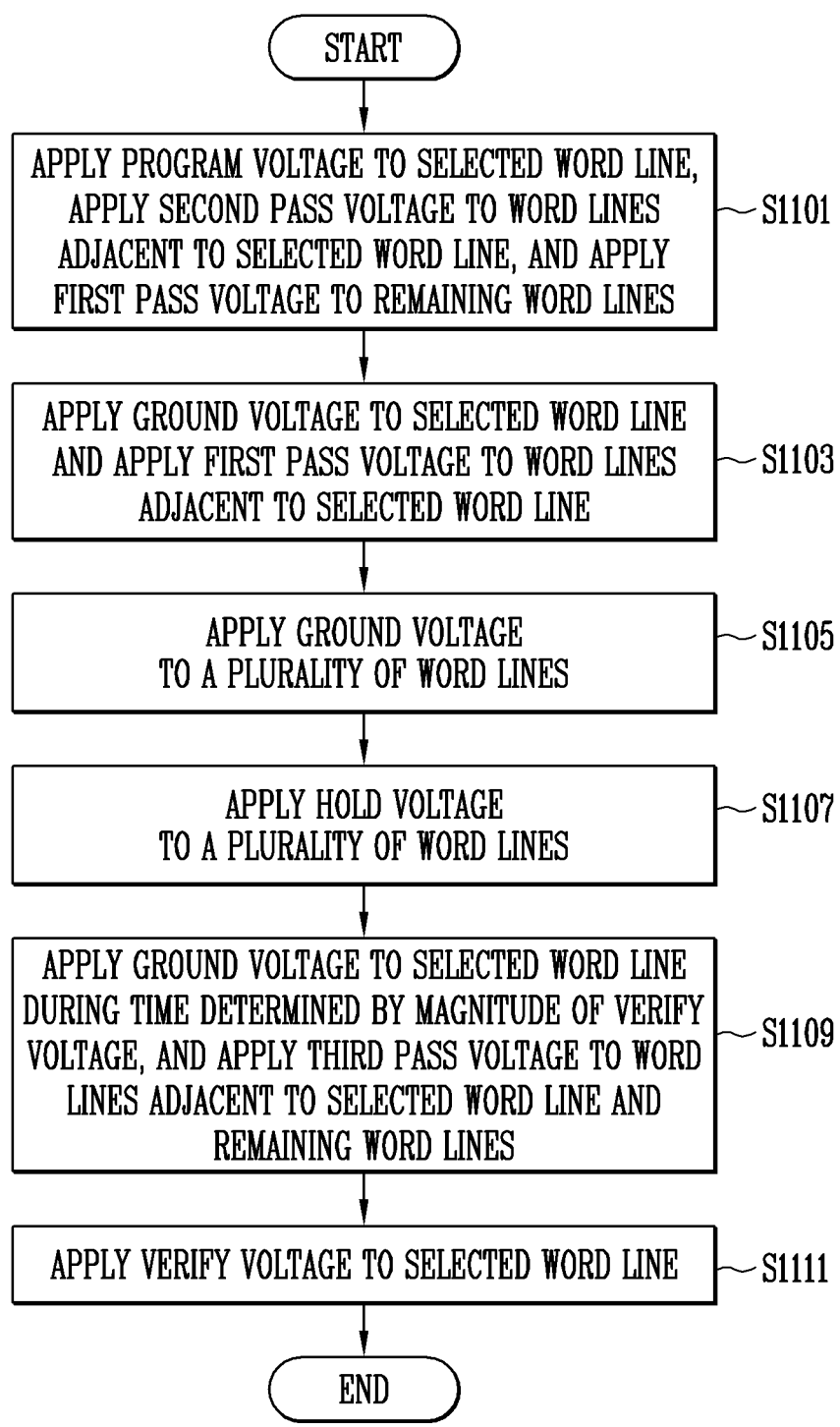
FIG. 11 is a flowchart illustrating a program operation of a memory device according to an embodiment of the present disclosure.

FIG. 11 is a flowchart illustrating a program operation of the memory device 100 according to an embodiment of the present disclosure.

Referring to FIG. 11, at operation S1101, the memory device 100 may apply a program voltage to a selected word line, apply a second pass voltage to word lines adjacent to the selected word line, and apply a first pass voltage to the remaining word lines. The remaining word lines may refer to word lines, except for the selected word line and the word lines adjacent to the selected word line, among the plurality of word lines. The magnitude of the second pass voltage may be greater than the first pass voltage.

At operation S1103, the memory device 100 may apply the ground voltage to the selected word line and the first pass voltage to the word lines adjacent to the selected word line. According to an embodiment, after the first pass voltage is applied to the word lines adjacent to the selected word line, the voltage magnitude of the plurality of word lines may be changed to the first pass voltage.

At operation S1105, the memory device 100 may apply the ground voltage to the plurality of word lines. According to an embodiment, the voltage magnitude of the plurality of word lines may be equal to or less than the magnitude of the hold voltage.

At operation S1107, the memory device 100 may apply the hold voltage to the plurality of word lines.

At operation S1109, the memory device 100 may apply the ground voltage to the selected word line during the time which is determined by the magnitude of the verify voltage, and may apply a third pass voltage to the word lines adjacent to the selected word line and the remaining word lines. For example, the time determined by the magnitude of the verify voltage may correspond to the length of the period from t3 to t31 as shown in FIG. 9. As the magnitude of the verify voltage increases, the time during which the ground voltage is applied to the selected word line may decrease. According to an embodiment, the memory device 100 may apply a voltage lower than the verify voltage to the selected word line during the time determined by the magnitude of the verify voltage. In another embodiment, after the memory device 100 applies the voltage less than the ground voltage to the selected word line during a predetermined time, the memory device 100 may apply the ground voltage to the selected word line during the time determined by the magnitude of the verify voltage.

At operation S1111, the memory device 100 may apply the verify voltage to the selected word line.

Figure 12:
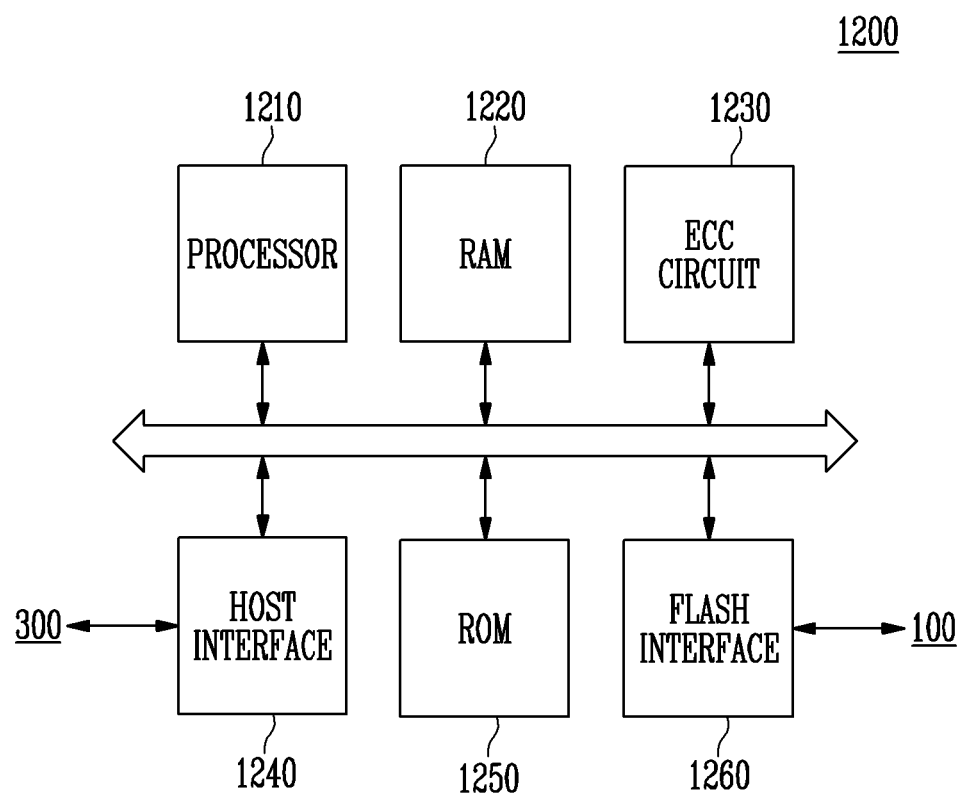
FIG. 12 is a diagram illustrating a memory controller of FIG. 1 according to an embodiment of the present disclosure.

FIG. 12 is a block diagram illustrating the memory controller 200 shown in FIG. 1 according to an embodiment of the present disclosure.

A memory controller 1200 of FIG. 12 may indicate the memory controller 200 of FIG. 1.

Referring to FIG. 12, the memory controller 1200 may include a processor 1210, a RAM 1220, an ECC circuit 1230, a host interface 1240, a ROM 1250, and a flash interface 1260.

The processor 1210 may control the general operations of the memory controller 1200. The RAM 1220 may serve as a buffer memory, a cache memory, or a working memory of the memory controller 1200.

The ECC circuit 1230 may correct errors. The ECC circuit 1230 may perform ECC encoding based on data to be written to the memory device 100 through the flash interface 1260. The ECC-encoded data may be transferred to the memory device 100 through the flash interface 1260. The ECC circuit 1230 may perform ECC decoding on the data transferred from the memory device 100 through the flash interface 1260. For example, the ECC circuit 1230 may be included in the flash interface 1260 as a component of the flash interface 1260.

The ROM 1250 may store various types of information in the form of firmware which is required for the memory controller 1200 to operate.

The memory controller 1200 may communicate with an external device, for example, the host 300 and an application processor, through the host interface 1240.

The memory controller 1200 may communicate with the memory device 100 through the flash interface 1260. The memory controller 1200 may transfer a command, an address and a control signal to the memory device 100, and may receive data through the flash interface 1260. For example, the flash interface 1260 may include a NAND interface.

Figure 13:
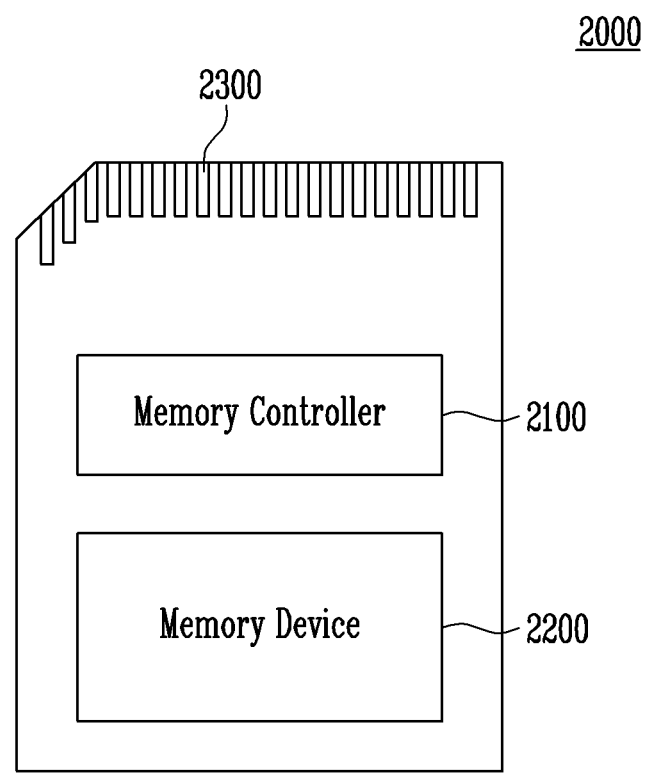
FIG. 13 is a block diagram illustrating a memory card system to which a memory system is applied according to an embodiment of the present disclosure.

FIG. 13 is a block diagram illustrating a memory card system 2000 to which a memory system is applied according to an embodiment of the present disclosure.

Referring to FIG. 13, the memory card system 2000 may include a memory controller 2100, a memory device 2200, and a connector 2300.

The memory controller 2100 may be coupled to the memory device 2200. The memory controller 2100 may be configured to access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory controller 2100 may have the same configuration as the memory controller 200 as described above with reference to FIG. 1. The memory device 2200 may have the same configuration as the memory device 100 as described above with reference to FIG. 1.

In an embodiment, the memory controller 2100 may include components, such as a Random Access Memory (RAM), a processing unit, a host interface, a memory interface, and an ECC circuit.

The memory controller 2100 may communicate with an external device through the connector 2300. The memory controller 2100 may communicate with an external device (e.g., the host) based on a specific communication protocol. In an embodiment, the memory controller 2100 may communicate with the external device through at least one of various communication standards or interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication standards or interfaces.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque Magnetic RAM (STT-MRAM).

The memory device 2200 and the memory controller 2100 may be integrated into a single semiconductor device to form a memory card. For example, the memory controller 2100 and the memory device 2200 may be integrated into a single semiconductor device and form a memory card, such as a personal computer memory card international association (PCMCIA), a compact flash (CF) card, a smart media card (SM or SMC), a memory stick, a multimedia card (MMC, RS-MMC, or MMCmicro), a secure digital (SD) card (SD, miniSD, microSD, or SDHC), a universal flash storage (UFS), and the like.

Figure 14:
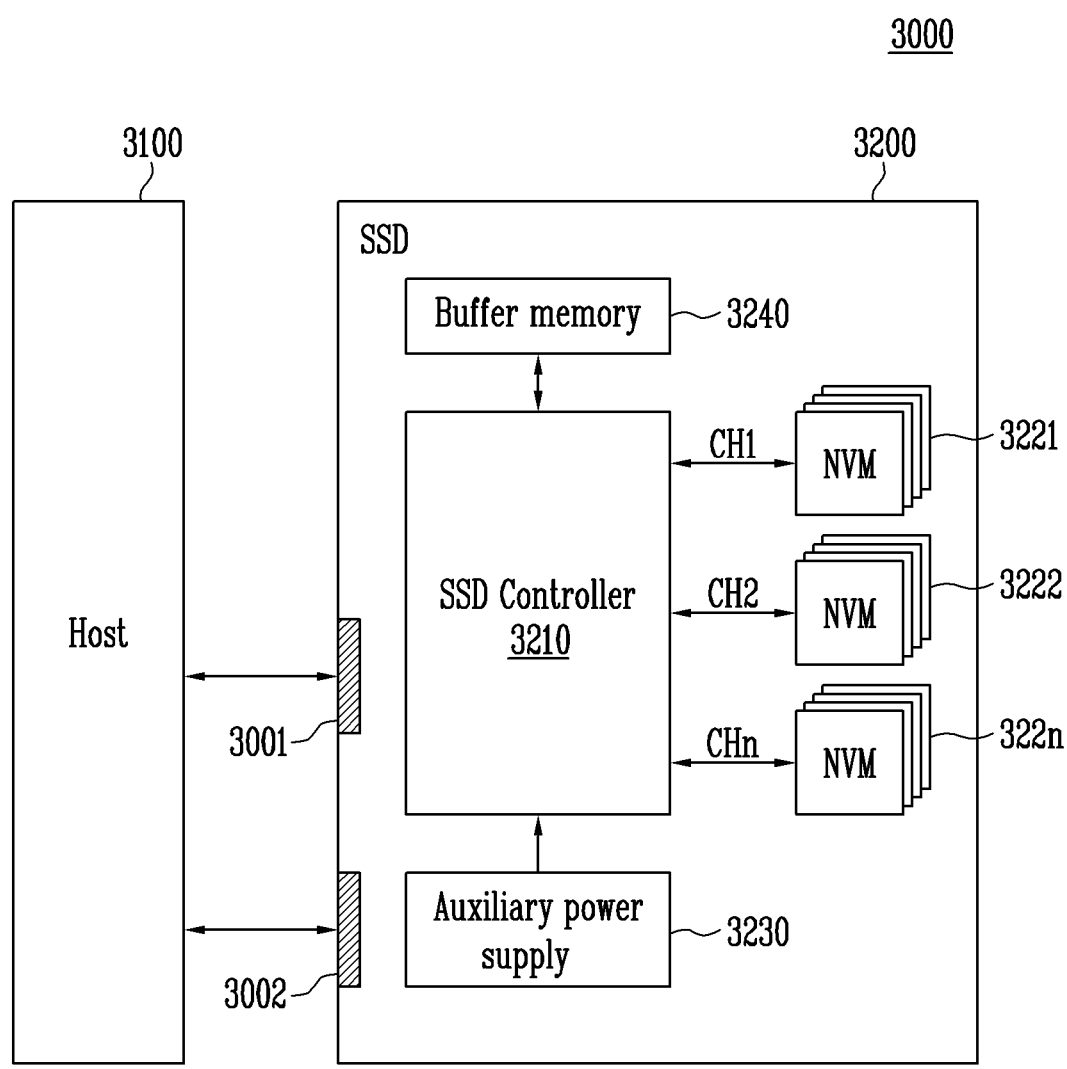
FIG. 14 is a block diagram illustrating a solid state drive (SSD) system to which a memory system is applied according to an embodiment of the present disclosure.

FIG. 14 is a block diagram illustrating a solid state drive (SSD) system 3000 to which a memory system is applied according to an embodiment of the present disclosure.

Referring to FIG. 14, the SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 as described above with reference to FIG. 1.

The SSD controller 3210 may control the plurality of flash memories 3221 to 322n in response to the signals received from the host 3100. In an embodiment, the signals may be based on the interfaces of the host 3100 and the SSD 3200. For example, the signals may be defined by at least one of various communication standards or interfaces such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied and charged with the power from the host 3100. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may operate as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM, or nonvolatile memories such as FRAM, ReRAM, STT-MRAM, and PRAM.

Figure 15:
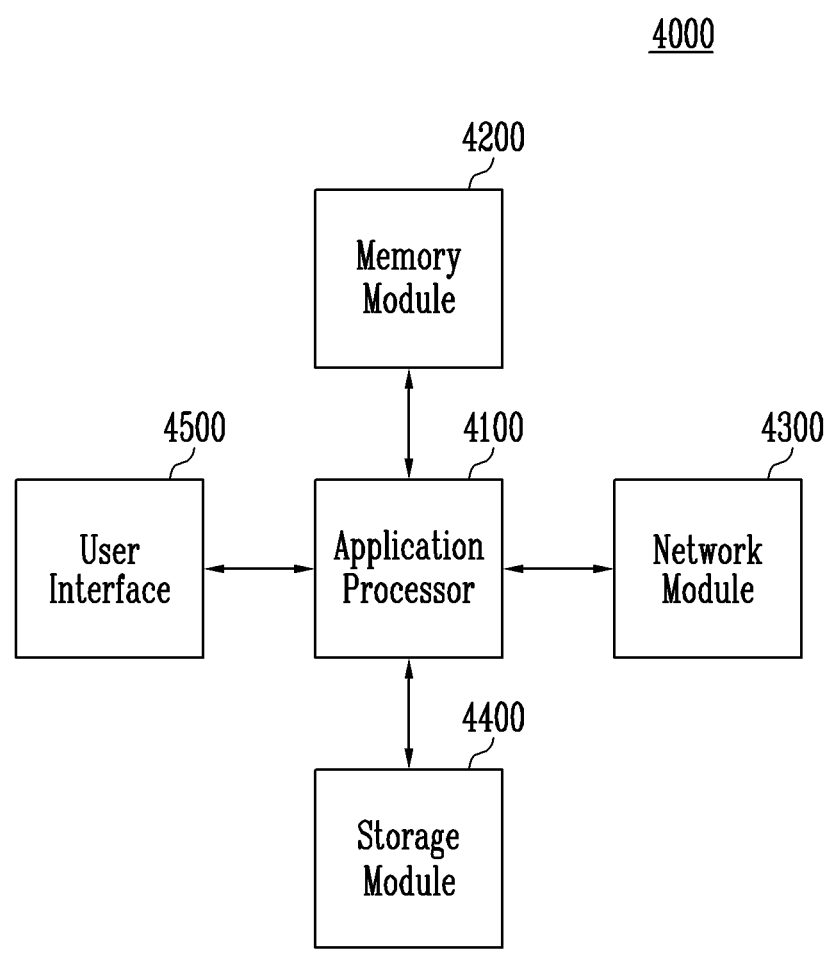
FIG. 15 is a block diagram illustrating a user system to which a memory system is applied according to an embodiment of the present disclosure.

FIG. 15 is a block diagram illustrating a user system 4000 to which a memory system is applied according to an embodiment of the present disclosure.

Referring to FIG. 15, the user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

For example, the storage module 4400 may include a plurality of non-volatile memory devices, and the plurality of non-volatile memory devices may operate in the same manner as the memory device 100 described above with reference to FIG. 1. The storage module 4400 may operate in the same manner as the storage device 50 as described above with reference to FIG. 1.

The user interface 4500 may include interfaces which input data or commands to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to the present disclosure, a memory device capable of reducing a program time and an operating method thereof may be provided. Based on embodiments of the present disclosure described above, the program time of the memory system may be advantageously reduced or minimized. Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A method of operating a memory device including a plurality of memory cells coupled to a plurality of word lines, the method comprising:
applying a program voltage to a selected word line among the plurality of word lines, a first pass voltage to remaining word lines except for the selected word line and adjacent word lines neighboring the selected word line among the plurality of word lines, and a second pass voltage to the adjacent word lines;
applying a ground voltage to the selected word line and the first pass voltage to the adjacent word lines;
applying the ground voltage to the plurality of word lines after applying the ground voltage to the selected word line and the first pass voltage to the adjacent word lines;
applying a hold voltage to the plurality of word lines after applying the ground voltage to the plurality of word lines; and
applying a pre-voltage which is lower than a verify voltage to the selected word line and a third pass voltage to the adjacent word lines and the remaining word lines during a first time period after applying the hold voltage to the plurality of word lines,
wherein the hold voltage is less than the first pass voltage and is greater than the ground voltage.

2. The method of claim 1, wherein the pre-voltage is the ground voltage.

3. The method of claim 2, further comprising applying a verify voltage to the selected word line after applying the ground voltage to the selected word line during the first time period.

4. The method of claim 3, further comprising applying, after applying the hold voltage to the plurality of word lines, a voltage lower than the ground voltage to the selected word line during a second time period before the first time period.

5. The method of claim 3, wherein the first time period decreases as a magnitude of the verify voltage increases.

* * * * *